(12) United States Patent
Matsuoka (10) Patent No.: US 6,915,118 B2
(45) Date of Patent: Jul. 5, 2005

(54) LINEAR COMPENSATED AMPLIFYING EQUIPMENT

(75) Inventor: Akihiko Matsuoka, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 850 days.

(21) Appl. No.: 09/885,819

(22) Filed: Jun. 20, 2001

(65) Prior Publication Data

US 2002/0025790 A1 Feb. 28, 2002

(30) Foreign Application Priority Data

Jun. 21, 2000 (JP) .......................................... 2000-185856

(51) Int. Cl.[7] .................................................. H01Q 11/12
(52) U.S. Cl. ............................... 455/126; 455/114.3
(58) Field of Search .............................. 455/126–127.3, 455/114.3; 375/296, 232

(56) References Cited

U.S. PATENT DOCUMENTS

| | | | | |
|---|---|---|---|---|
| 4,617,522 A | * | 10/1986 | Tarbutton et al. | 330/149 |
| 5,909,642 A | * | 6/1999 | Suzuki | 455/114 |
| 6,366,177 B1 | * | 4/2002 | McCune et al. | 332/103 |
| 6,512,417 B2 | * | 1/2003 | Booth et al. | 330/149 |
| 6,567,478 B2 | * | 5/2003 | Oishi et al. | 375/297 |
| 6,751,447 B1 | * | 6/2004 | Jin et al. | 455/114.3 |

FOREIGN PATENT DOCUMENTS

| | | |
|---|---|---|
| JP | 4-47804 | 2/1992 |
| JP | 4-290321 | 10/1992 |
| JP | 5-183349 | 7/1993 |
| JP | 8-251246 | 9/1996 |
| JP | 10-270950 | 10/1998 |

OTHER PUBLICATIONS

U.S. Patent Application No. 2001/0030581 (Dent), Oct. 2001.*

* cited by examiner

Primary Examiner—William J. Deane, Jr.
(74) Attorney, Agent, or Firm—RatnerPrestia (57) ABSTRACT

In a transmission power amplifying unit used for radio communications, a non-linear distortion compensator is provided before its main power amplifier. The compensator compensates the main power amplifier for non-linear distortions so as to perform non-linear distortion compensation prior to power amplification of a transmission signal. The transmission signal that has undergone the non-linear distortion compensation is amplified by the main power amplifier. The phase of either the output of the amplifier or the transmission signal is controlled and these two signals are synthesized so that they are in opposite phase. This operation can reduce non-linear distortion components generated in the main power amplifier and thus power consumption of the amplifier. As a result, power consumption of the auxiliary amplifier is reduced and efficiency of power used in the linear compensated amplifying equipment can be improved.

28 Claims, 8 Drawing Sheets

FIG. 8 ical distortions that are generated in a transmission power amplifying unit used for radio communications, known is that used in feedforward linear compensated amplifying equipment disclosed in Japanese Patent Non-Examined Publication No. 10-270950. This equipment employs a method -->

LINEAR COMPENSATED AMPLIFYING EQUIPMENT

FIELD OF THE INVENTION

The present invention relates to linear compensated amplifying equipment that is used in a transmitting unit for radio communications.

BACKGROUND OF THE INVENTION

As a conventional technique of compensating for non-linear distortions that are generated in a transmission power amplifying unit used for radio communications, known is that used in feedforward linear compensated amplifying equipment disclosed in Japanese Patent Non-Examined Publication No. 10-270950. This equipment employs a method of the following steps: extracting in its non-liner distortion extractor a non-linear distortion component generated in its main power amplifier; amplifying the non-linear distortion component in its auxiliary power amplifier; and suppressing the non-linear distortion component of a transmission signal by adding the extracted component to an output signal from the main power amplifier so that the two signals are in opposite phase.

However, this conventional linear compensated amplifying equipment has a problem that it requires an auxiliary power amplifier capable of linear amplification and thus efficiency of power utilization in the transmission power amplifying unit is considerably reduced.

SUMMARY OF THE INVENTION

The present invention addresses this problem. Therefore, it is an object of the present invention to improve efficiency of power utilization in a transmission power amplifying unit when feedforward linear compensated amplifying equipment is used as the amplifying unit.

In accordance with the present invention, in a transmission power amplifying unit used for radio communications, a non-linear distortion compensator that compensates a main power amplifier for non-linear distortions is provided before the main power amplifier so as to perform non-linear distortion compensation of a transmission signal prior to power amplification. The transmission signal that has undergone non-linear distortion compensation is amplified in the main power amplifier. Then, the phase of either the output signal from the main power amplifier or a transmission signal is controlled and these two signals are synthesized so that they are in opposite phase. This operation can reduce non-linear distortion components generated in the main power amplifier and thus the power consumption of the amplifier. Therefore, the power consumption of the auxiliary power amplifier is reduced and efficiency of power utilization in the linear compensated amplifying equipment can be improved.

DETAILED DESCRIPTION OF THE EXEMPLARY EMBODIMENTS

Exemplary embodiments of the present invention are hereinafter demonstrated in detail with reference to the accompanying drawings.

Embodiment 1

Figure 1:
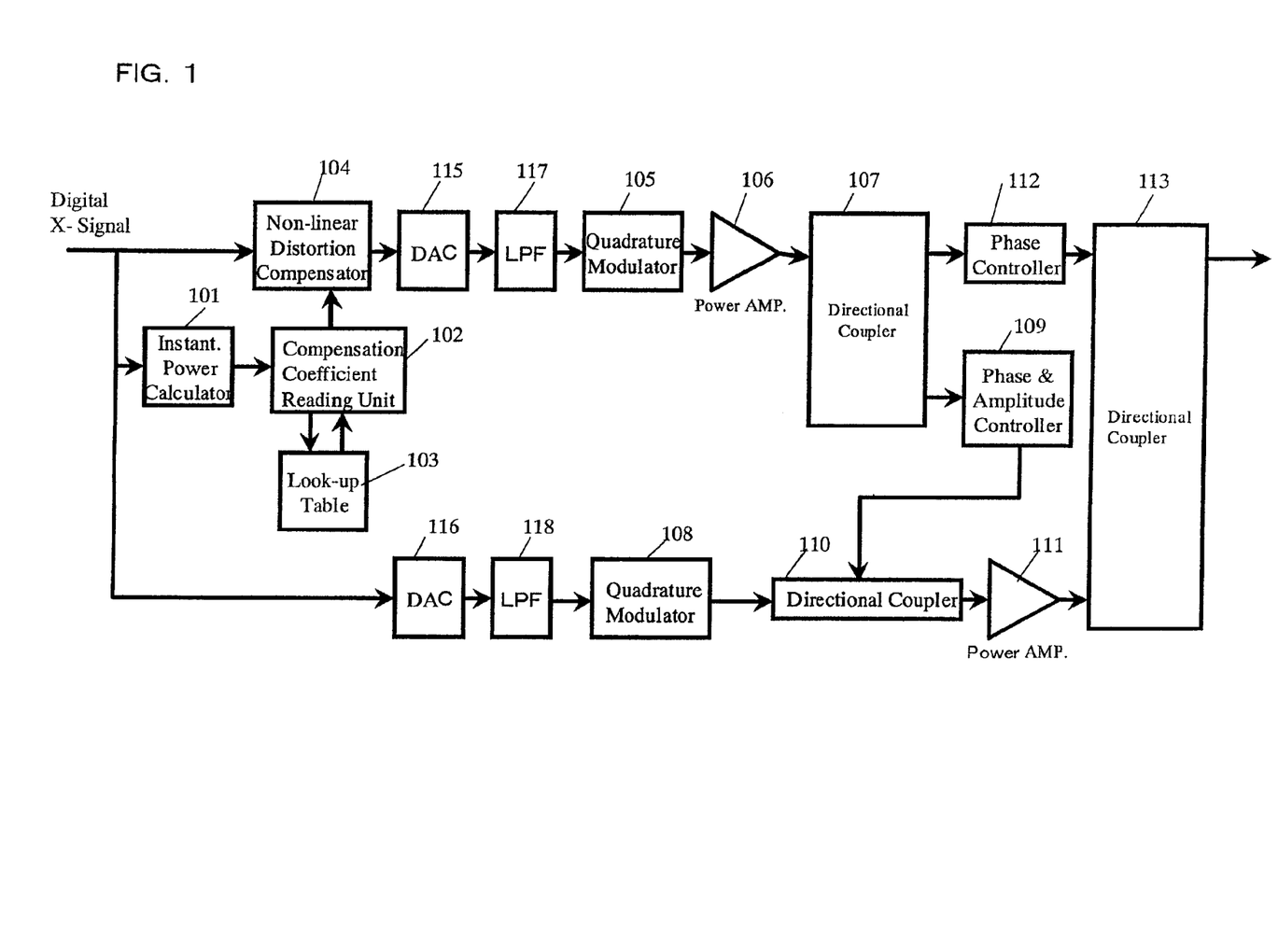
FIG. 1 is a block diagram illustrating a structure of linear compensated amplifying equipment in accordance with a first exemplary embodiment of the present invention.

FIG. 1 illustrates a structure of linear compensated amplifying equipment in accordance with a first exemplary embodiment of the present invention. Transmission signals are digital signals comprising I (in-phase) signals and Q (quadrature phase) signals, and are trifurcated and fed into non-linear distortion compensator 104, instantaneous power calculator 101 and digital-analog (DA) converter 116, respectively. A transmission signal that has undergone conversion in DA converter 116 are filtered through low-pass filter 118, quadrature-modulated in second quadrature modulator 108 and then fed into directional coupler 110.

Instantaneous power calculator 101 computes instantaneous power $I^2+Q^2$ of the digital transmission signals. Compensation coefficient reading unit 102 refers to look-up table 103 using the instantaneous power computed in calculator 101 as a reference address. In look-up table 103, compensation coefficients (complex vectors) for compensating main power amplifier 106 for non-linear distortions are stored. Look-up table 103 feeds the compensation coefficient read by reading unit 102 using the reference address into non-linear distortion compensator 104 via reading unit 102. Non-linear distortion compensator 104 compensates the digital transmission signal for a non-linear distortion by computing a complex product of the input digital transmission signal and the compensation coefficient. Instantaneous power calculator 101, compensation coefficient reading unit 102, look-up table 103 and non-linear distortion compensator 104 form a preliminary non-linear distortion compensation circuit using a look-up table system for main power amplifier 106. The above operation of compensating for non-linear distortions is performed on each signal component of digital signals, which are input signals.

The digital transmission signal that has undergone non-linear distortion compensation in the above-mentioned manner is converted into an analog signal in DA converter 115, filtered through low-pass filter 117, quadrature-modulated in first quadrature modulator 105, and amplified to a desired power value in main power amplifier 106.

Figure 2:
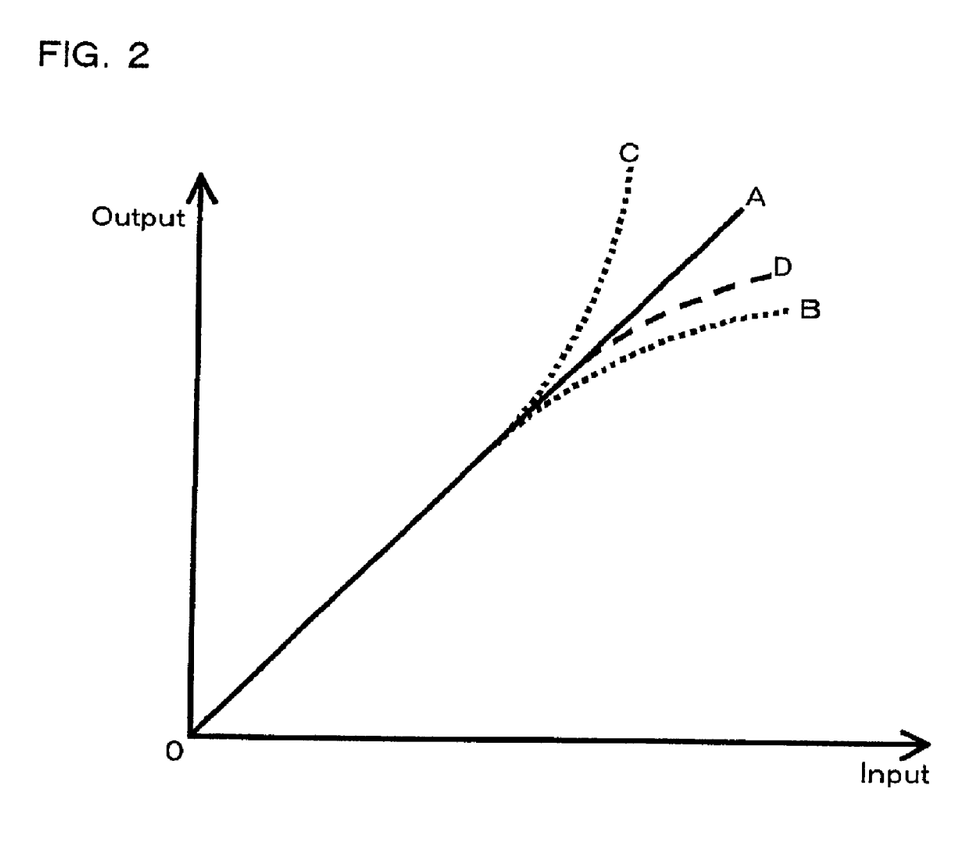
FIG. 2 is a graph of input-output characteristics for explaining an operation of the linear compensated amplifying equipment in accordance with the present invention.

FIG. 2 is a graph showing input-output characteristics of main power amplifier 106 for explaining the operation described above. Straight line A shows the characteristics when main power amplifier 106 performs linear amplification. However, main power amplifier 106 has non-linear characteristics of being generally saturated at large output. In other words, since output characteristics of the amplifier are saturated as shown by curve B with larger input signals, the amplifier exhibits non-linear characteristics. Then, compensation coefficients exhibiting non-linear characteristics as shown by curve C are stored in look-up table 103. When reading unit 102 reads out these coefficients and non-linear distortion compensator 104 computes complex products of the input signals and coefficients, non-linear distortions as shown by curve C are added to the transmission signals. When main power amplifier 106 having input-output characteristics as shown by curve B amplifies these signals, the exhibited input-output characteristics are as shown by curve D and the non-linear characteristics are improved. Since the power of distortion components of main power amplifier 106 corresponds to the deviation from straight line A, the power of distortion components reduces from values corresponding to curve B to those corresponding to curve D. Thus, the power dealt with in auxiliary power amplifier 111 described below can be reduced.

Returning to FIG. 1, the output from power amplifier 106 is bifurcated by directional coupler 107, which serves as a distributor. One of the output is fed into phase and amplitude controller, 109, where the signal is controlled so as to be the same as the output of second quadrature modulator 108 in amplitude and opposite in phase, and fed into directional coupler 110. Directional coupler 110 synthesizes the output of quadrature modulator 108 and the output of phase and amplitude controller 109 so as to extract non-linear distortion components generated in main power amplifier 106 (corresponding to curve D in FIG. 2). The extracted non-linear distortion component signal is amplified in auxiliary power amplifier 111 to a power value equal to that of the non-linear distortion component of the output from main power amplifier 106 and fed into directional coupler 113.

On the other hand, the other of the output from directional coupler 107 is fed into phase controller 112. Phase controller 112 controls the output of main power amplifier 106 so that the signal is opposite to the output of auxiliary power amplifier 111 in phase, and feeds the controlled output into directional coupler 113. Directional coupler 113 synthesizes these two signals so as to eliminate a non-linear distortion component from the output of main power amplifier 106. As a result of these operations, the output of directional coupler 113 corresponding to straight line A can be obtained and a modulation signal is synthesized as linearly compensated transmission output.

With the above-mentioned structure, preliminary non-linear distortion compensation performed using a look-up table system in non-linear distortion compensator 104 can reduce non-linear distortion components generated in main power amplifier 106. Therefore, since the power of non-linear distortion components to be extracted in directional coupler 110 can be reduced, power consumption in auxiliary power amplifier 111 can be reduced. Consequently, efficiency of power used in the entire linear compensated amplifying equipment can be improved.

As mentioned above, in accordance with this embodiment, a preliminary non-linear distortion compensation circuit using a look-up table system provided before main power amplifier 106 reduces non-linear distortion components generated in main power amplifier 106 and thus accomplishes lower power consumption of auxiliary power amplifier 111. Therefore, feedforward linear compensated amplifying equipment that efficiently utilizes its power can be constructed.

Embodiment 2

Figure 3:
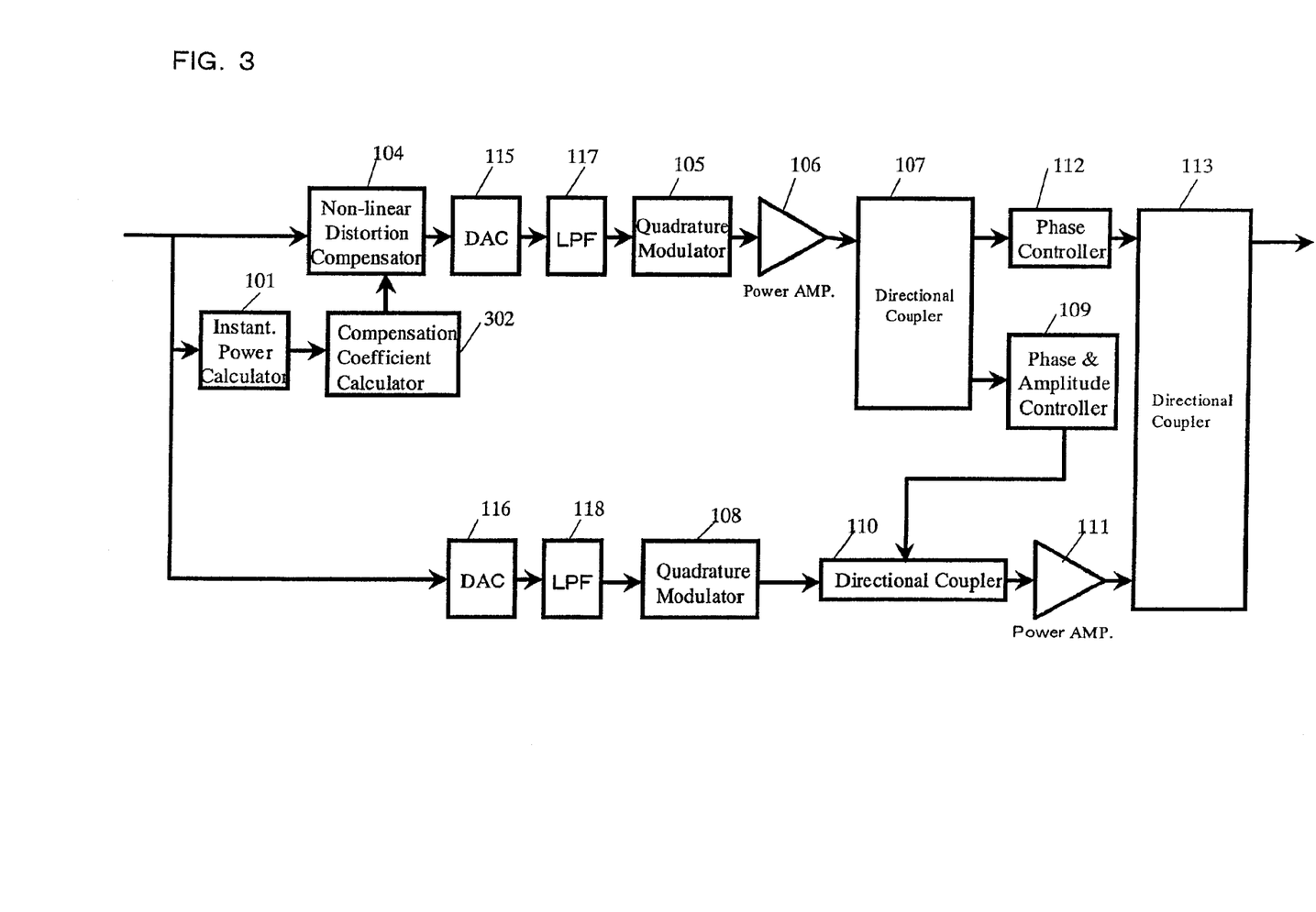
FIG. 3 is a block diagram illustrating a structure of linear compensated amplifying equipment in accordance with a second exemplary embodiment of the present invention.

FIG. 3 shows a structure of linear compensated amplifying equipment in accordance with a second exemplary embodiment of the present invention. In this embodiment, instantaneous power calculator 101, compensation coefficient calculator 302, and non-linear distortion compensator 104 form a preliminary non-linear distortion compensation circuit using an approximate expression. In FIG. 3, the same elements as those shown in FIG. 1 are denoted with the same reference numerals.

Digital signals are trifurcated and supplied to non-linear distortion compensator 104, instantaneous power calculator 101 and DA converter 116, respectively. The transmission signal that has been fed into DA converter 116 is filtered through low-pass filter 118, quadrature-modulated in second quadrature modulator 108, and then supplied to directional coupler 110.

Instantaneous power calculator 101 computes instantaneous power $I^2+Q^2$ of the digital transmission signals. Compensation coefficient calculator 302 approximates a compensation coefficient (complex vector) for compensating main power amplifier 106 for a non-linear distortion according to a predetermined calculation expression, using the instantaneous power value computed in calculator 101 as a parameter, and feeds the determined compensation coefficient into non-linear distortion compensator 104. Non-linear distortion compensator 104 computes a complex product of the input transmission signal and the compensation coefficient for non-linear distortion compensation.

Since the operations are the same as those of corresponding elements described in Embodiment 1, the description of operations after this step is omitted.

With the above-mentioned structure, preliminary non-linear distortion compensation performed using approximation in non-linear distortion compensator 104 can reduce non-linear distortion components generated in main power amplifier 106. Therefore, since the power of non-linear distortion components to be extracted in directional coupler 110 can be reduced, the power consumption in auxiliary power amplifier 111 can be reduced. Consequently, efficiency of power used in the entire linear compensated amplifying equipment can be improved.

As mentioned above, in accordance with this embodiment, a preliminary non-linear distortion compensation circuit using an approximation system provided before main power amplifier 106 can reduce non-linear distortion components generated in main power amplifier 106 and thus accomplishes lower power consumption of the auxiliary power amplifier. Therefore, feedforward linear compensated amplifying equipment that efficiently utilizes its power can be constructed.

Embodiment 3

Figure 4:
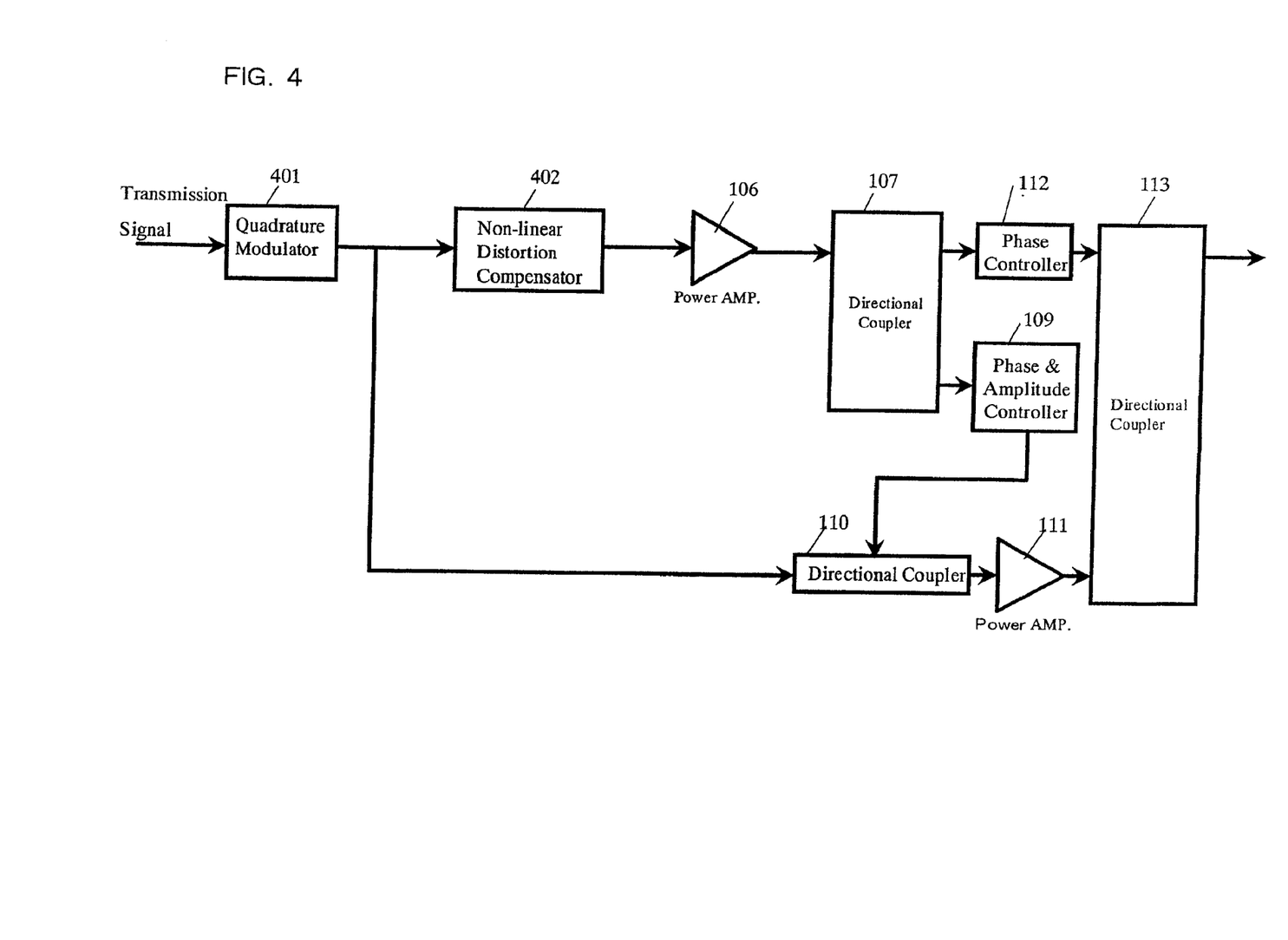
FIG. 4 is a block diagram illustrating a structure of linear compensated amplifying equipment in accordance with a third exemplary embodiment of the present invention.

FIG. 4 shows a structure of linear compensated amplifying equipment in accordance with a third exemplary embodiment of the present invention. In FIG. 4, the same elements as shown in FIG. 1 are denoted with the same reference numerals.

Analog transmission signals are quadrature-modulated in quadrature modulator 401 and then bifurcated. One of the output is subjected to non-linear distortion compensation in non-linear distortion compensator 402 and amplified to desired power in main power amplifier 106. Non-linear distortion compensator 402 is made of a non-linear element that is opposite to the main power amplifier in characteristics except for the gain, such as a diode. The compensator receives the output of quadrature modulator 401 so as to perform non-linear distortion compensation in accordance with the characteristics of the non-linear element.

The output from main power amplifier 106 is bifurcated by directional coupler 107. One of the output is fed into phase and amplitude controller 109, where the signal is controlled so as to be the same as the output of quadrature modulator 401 in amplitude and opposite in phase, and fed into one input terminal of directional coupler 110. The other input terminal of directional coupler 110 receives a signal of the other output from quadrature modulator 401. Directional coupler 110 synthesizes these two signals so as to extract a non-linear distortion component generated in main power amplifier 106. The extracted non-linear distortion component signal is amplified in auxiliary power amplifier 111 to a power value equal to the non-linear distortion component of the output from main power amplifier 106 and fed into directional coupler 113.

The other of the output from directional coupler 107 is fed into phase controller 112. Phase controller 112 controls the output of main power amplifier 106 so that the output is opposite to the output of auxiliary power amplifier 111 in phase, and feeds into directional coupler 113. Directional coupler 113 synthesizes these two signals so as to eliminate a non-linear distortion component from the output of main power amplifier 106 and synthesize a modulation signal as transmission output.

In the above-mentioned manner, preliminary non-linear distortion compensation performed using a non-linear element in non-linear distortion compensator 402 can reduce non-linear distortion components generated in main power amplifier 106. Therefore, since the power of non-linear distortion components to be extracted in directional coupler 110 can be reduced, the power consumption in auxiliary power amplifier 111 can be reduced. Consequently, efficiency of power used in the linear compensated amplifying equipment can be improved.

As for the non-linear element used in non-linear distortion compensator 402, filters or non-linear characteristics circuits that exhibit input-output characteristics canceling non-linearity of main power amplifier 106 have the same effects as diodes.

As mentioned above, in accordance with this embodiment, a preliminary non-linear distortion compensation circuit of a non-linear element provided before main power amplifier 106 reduces non-linear distortion components generated in main power amplifier 106 and accomplishes lower power consumption of the auxiliary power amplifier. Therefore, feedforward linear compensated amplifying equipment that efficiently utilizes its power can be constructed.

Embodiment 4

Figure 5:
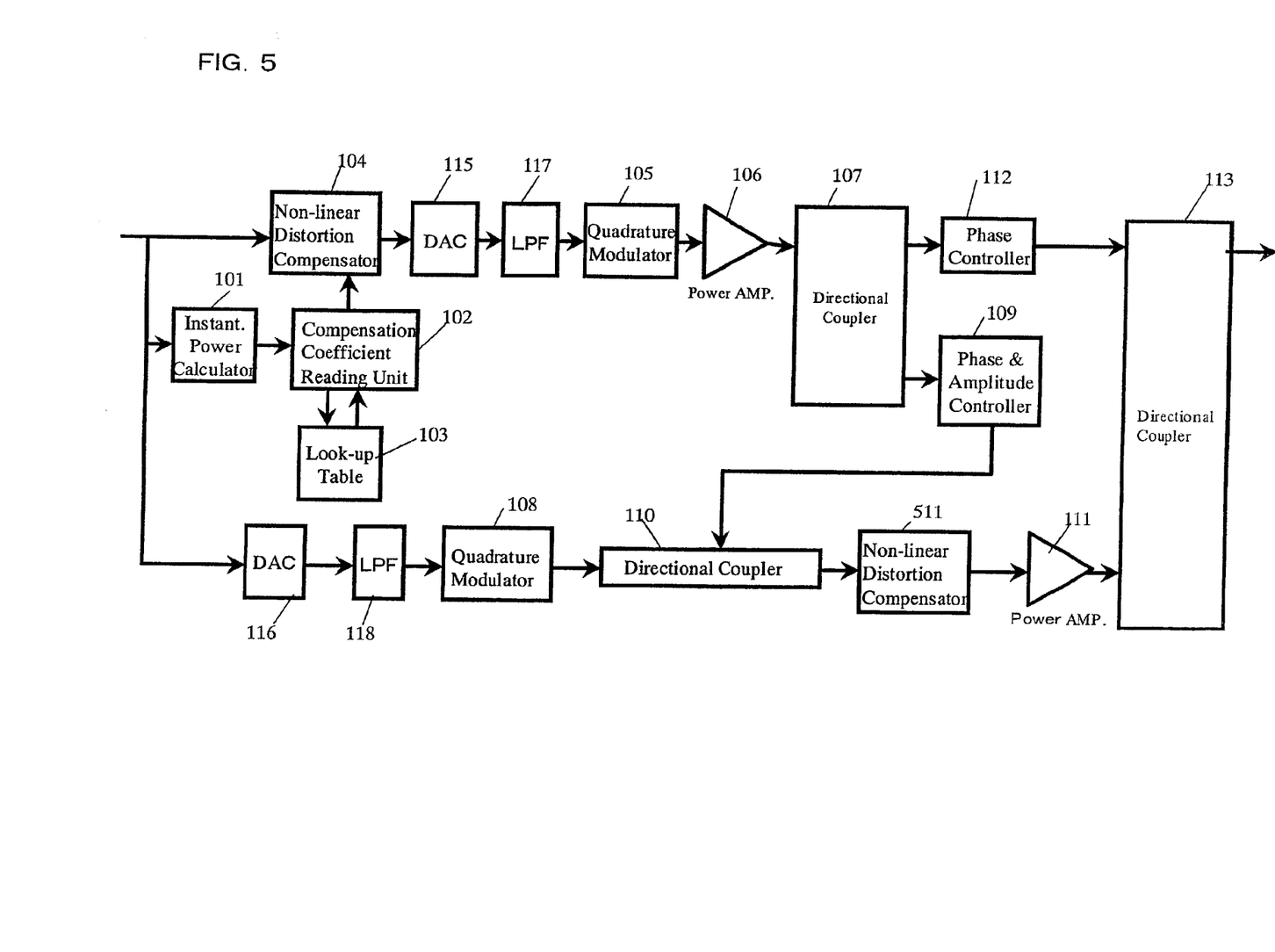
FIG. 5 is a block diagram illustrating a structure of linear compensated amplifying equipment in accordance with a fourth exemplary embodiment of the present invention.

FIG. 5 illustrates a structure of linear compensated amplifying equipment in accordance with a fourth embodiment of the present invention. The structure of this embodiment is essentially the same as that of Embodiment 1 described in FIG. 1 except that second non-linear distortion compensator 511 is provided before auxiliary power amplifier 111. Therefore, the respective elements corresponding to those in FIG. 1 are denoted with the same reference numerals. The description of the structure and operation of the same elements is omitted and only the description of different elements is given.

A non-linear distortion component that has been subjected to preliminary distortion compensation in first non-linear distortion compensator 104 and then generated in main power amplifier 106 is extracted in directional coupler 110. The extracted signal is subjected to preliminary non-linear distortion compensation in second non-linear distortion compensator 511 and then fed into auxiliary power amplifier 111, where the signal is amplified to the power equal to that of the non-linear distortion component of the output from main power amplifier 106. Non-linear distortion compensator 511 is made of a non-linear element that is opposite to auxiliary power amplifier 111 in characteristics except for the entire gain. The preliminary non-linear distortion compensation is performed by utilizing the characteristics of this non-linear element. The output of auxiliary power amplifier 111 that has undergone preliminary non-linear distortion compensation is synthesized with the output of phase controller 112 in directional coupler 113 so as to eliminate the non-linear distortion component from main power amplifier 106 and synthesize a modulation signal as transmission output.

In the above-mentioned manner, preliminary non-linear distortion compensation performed in first non-linear distortion compensator 104 can reduce non-linear distortion components generated in main power amplifier 106, and moreover, preliminary non-linear distortion compensation performed in second non-linear distortion compensator 511 can reduce non-linear distortion components generated in auxiliary power amplifier 111. As a result, power consumption in auxiliary power amplifier 111 can further be reduced.

As mentioned above, in accordance with this embodiment, a preliminary non-linear distortion compensation circuit using a look-up table system provided before the main power amplifier and a preliminary non-linear distortion compensator of a non-linear element provided before the auxiliary power amplifier accomplish lower power consumption of the main and auxiliary power amplifiers. Therefore, this embodiment has the effect of constructing feedforward linear compensated amplifying equipment that can efficiently utilize its power.

Embodiment 5

Figure 6:
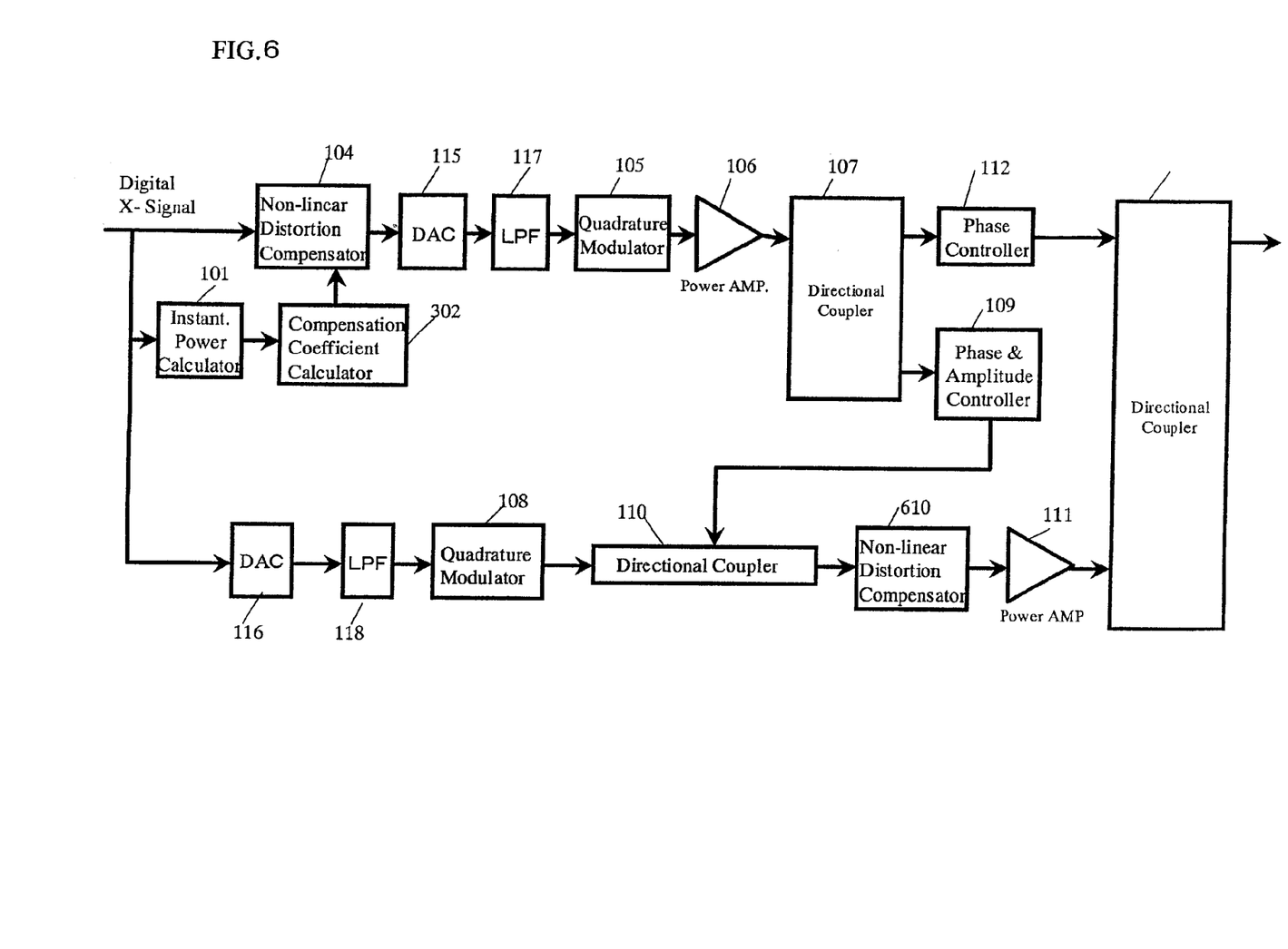
FIG. 6 is a block diagram illustrating a structure of linear compensated amplifying equipment in accordance with a fifth exemplary embodiment of the present invention.

FIG. 6 illustrates a structure of linear compensated amplifying equipment in accordance with a fifth embodiment of the present invention. The structure of this embodiment is essentially the same as that of Embodiment 2 described in FIG. 3 except that second non-linear distortion compensator 610 is provided before auxiliary power amplifier 111. Therefore, the respective elements corresponding to those in FIG. 3 are denoted with the same reference numerals. The description of the structure and operation of the same elements is omitted and only the description of different elements is given.

A non-linear distortion component that has been subjected to preliminary distortion compensation in first non-linear distortion compensator 104 and then generated in main power amplifier 106 is extracted in directional coupler 107. The extracted signal is subjected to preliminary non-linear distortion compensation in second non-linear distortion compensator 610 and then fed into auxiliary power amplifier 111, where the signal is amplified to the power equal to that of the non-linear distortion component of the output from main power amplifier 106. Non-linear distortion compensator 610 is made of a non-linear element that is opposite to auxiliary power amplifier 111 in characteristics except for the entire gain. The preliminary non-linear distortion compensation is performed by utilizing the characteristics of this non-linear element. The output of auxiliary power amplifier 111 that has undergone preliminary non-linear distortion compensation is synthesized with the output of phase controller 112 in directional coupler 113 so as to eliminate the non-linear distortion component from main power amplifier 106 and synthesize a modulation signal as transmission output.

In the above-mentioned manner, preliminary non-linear distortion compensation performed in first non-linear distortion compensator 104 can reduce non-linear distortion components generated in main power amplifier 106, and moreover, preliminary non-linear distortion compensation performed in second non-linear distortion compensator 610 can reduce non-linear distortion components generated in auxiliary power amplifier 111. As a result, power consumption in auxiliary power amplifier 111 can further be reduced.

As mentioned above, in accordance with this embodiment, a preliminary non-linear distortion compensation circuit using an approximation system provided before the main power amplifier and a preliminary non-linear distortion compensator of a non-linear element provided before its auxiliary power amplifier accomplish lower power consumption of the main and auxiliary power amplifiers. Therefore, this embodiment has the effect of constructing feedforward linear compensated amplifying equipment that can efficiently utilize its power.

Embodiment 6

Figure 7:
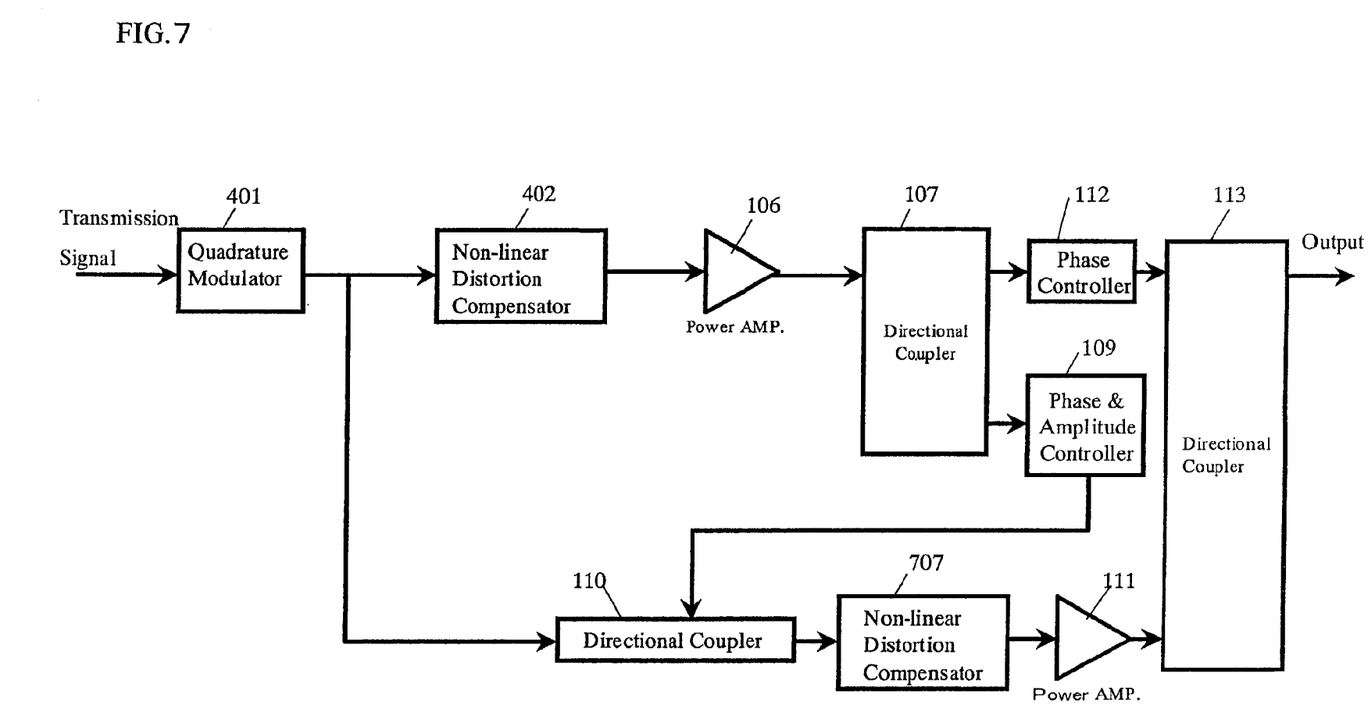
FIG. 7 is a block diagram illustrating a structure of linear compensated amplifying equipment in accordance with a sixth exemplary embodiment of the present invention.

FIG. 7 illustrates a structure of linear compensated amplifying equipment in accordance with a sixth embodiment of the present invention. The structure of this embodiment is essentially the same as that of Embodiment 3 described in FIG. 4 except that second non-linear distortion compensator 707 is provided before auxiliary power amplifier 111. Therefore, the respective elements corresponding to those in FIG. 4 are denoted with the same reference numerals. The description of the structure and operation of the same elements is omitted and only the description of different elements is given.

A non-linear distortion component that has been subjected to preliminary non-linear distortion compensation in first non-linear distortion compensator 402 and then generated in main power amplifier 106 is extracted in directional coupler 110. The extracted signal is subjected to preliminary non-linear distortion compensation in second non-linear distortion compensator 707 and then fed into auxiliary power amplifier 111, where the signal is amplified to the power equal to that of the non-linear distortion component of the output from main power amplifier 106. Non-linear distortion compensator 707 is made of a non-linear element that is opposite to auxiliary power amplifier 111 in characteristics except for the entire gain. The preliminary non-linear distortion compensation is performed utilizing the characteristics of this non-linear element. The output of auxiliary power amplifier 111 that has undergone preliminary non-linear distortion compensation is synthesized with the output of phase controller 112 in directional coupler 113 so as to eliminate the non-linear distortion component from main power amplifier 106 and synthesize a modulation signal as transmission output.

In the above-mentioned manner, preliminary non-linear distortion compensation performed in first non-linear distortion compensator 402 can reduce non-linear distortion components generated in main power amplifier 106, and moreover, preliminary non-linear distortion compensation performed in second non-linear distortion compensator 707 can reduce non-linear distortion components generated in auxiliary power amplifier 111. As a result, power consumption of auxiliary power amplifier 111 can further be reduced.

As mentioned above, in accordance with this embodiment, a preliminary non-linear distortion compensator of a non-linear element provided before the main power amplifier and a preliminary non-linear distortion compensator of a non-linear element provided before the auxiliary power amplifier accomplish lower power consumption of the main and auxiliary power amplifiers. Therefore, this embodiment has the effect of constructing feedforward linear compensated amplifying equipment that can efficiently utilize its power.

Although phase and amplitude controller 109 is disposed between directional couplers 107 and 110 in the description of Embodiments 1 through 6, the controller can be disposed before or after main power amplifier 106, or before directional coupler 110.

Likewise, phase controller 112 disposed between directional couplers 107 and 113 in the above description can be disposed before or after auxiliary power amplifier 111. In any case, the same effect can be obtained as long as the two signals fed into directional couplers 110 and 113 are controlled so as to be in opposite phase.

As for a means of distributing signals, such distribution circuits as a power splitter, and a distributor comprising a transformer can be used instead of directional coupler 107. In addition, a coupled circuit comprising a transformer can be used as a means of synthesizing signals instead of directional coupler 113.

Although each of main power amplifier 106 and auxiliary power amplifier 111 is made of one stage in the above-mentioned embodiments, the amplifiers can be made of a plurality of stages. Moreover, although quadrature modulators 105, 108 and 401 are described as a single-stage direct conversion system, the signals can be converted to intermediate frequencies and then quadrature-modulated.

DA converters 115 and 116 and low-pass filters 117 and 118 can be disposed after quadrature modulators 105 and 108, respectively.

Embodiment 7

Figure 8:
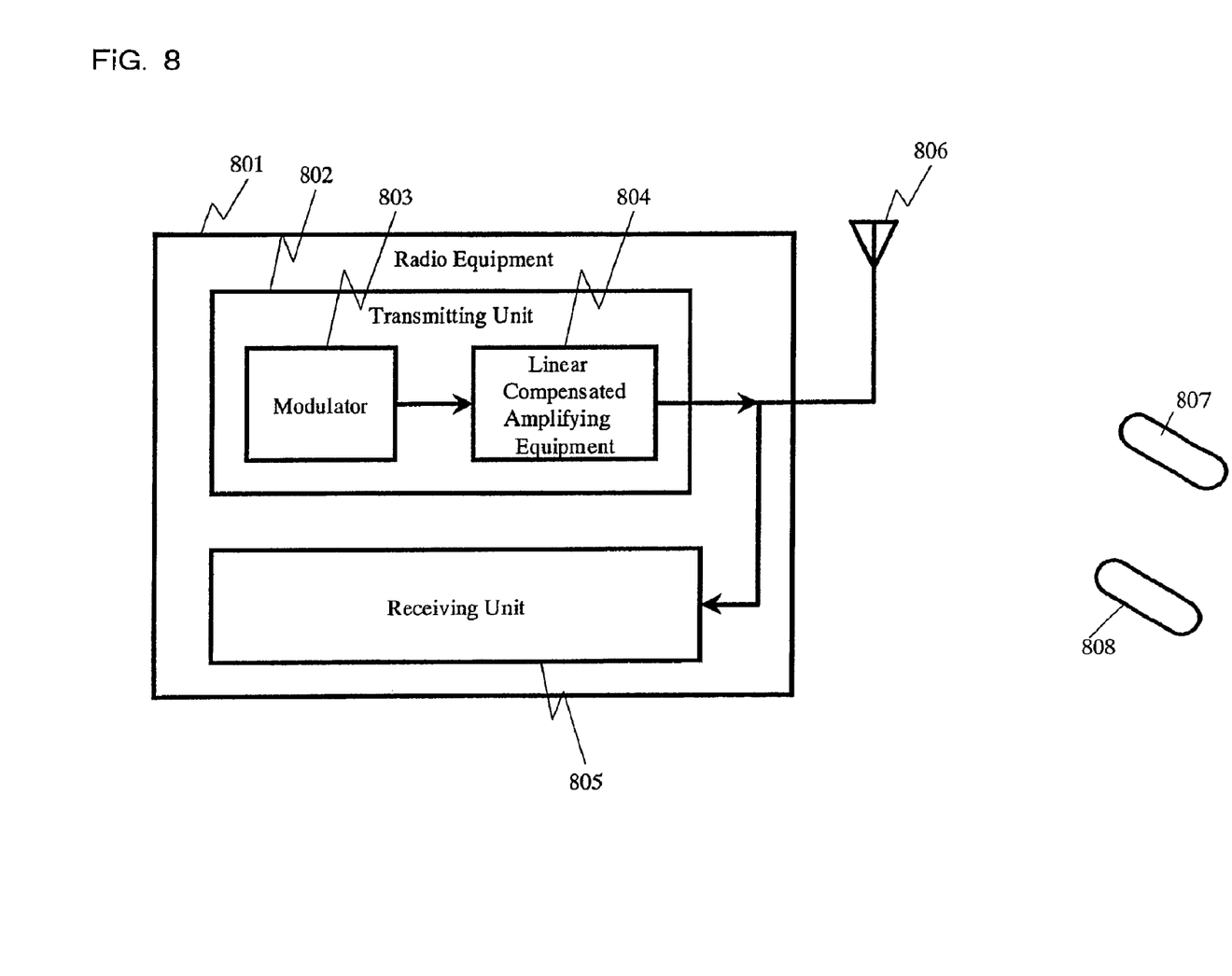
FIG. 8 is a block diagram illustrating a structure of linear compensated amplifying equipment in accordance with a seventh exemplary embodiment of the present invention.

FIG. 8 illustrates an example of a structure of radio equipment using linear compensated amplifying equipment in accordance with the present invention. The radio equipment is used in a mobile communication base station. Radio equipment 801 is made of transmitting unit 802 and receiving unit 805. Transmitting unit 802 is made of modulator 803 and linear compensated amplifying equipment in accordance with the present invention. Modulator 803 modulates signals to be transmitted, according to a predetermined modulation method, generates digital or analog transmission signals, and feeds them into linear compensated amplifying equipment 804. Linear compensated amplifying equipment 804 linearly amplifies the transmission signals to desired power using the methods described in Embodiments 1 to 6, and then transmits the amplified signals from antenna 806 to mobile stations 807 and 808.

The signals transmitted from mobile stations 807 and 808 are received by the antenna, and then received by receiving unit 805. Since the operation of the receiving unit is irrelevant to the present invention, the description is omitted.

As described above, although a linear amplifying unit in a transmitting system usually consumes large power in radio equipment 801, its power consumption can be reduced by using linear compensated amplifying equipment 804 as the amplifying unit, and thus efficiency of power used in radio equipment 801 can be improved. In this embodiment, the radio equipment is structured to have receiving unit 805. However, the same effect can be obtained even with a structure without receiving unit 805. A plurality of antennas 806 can be used and a single antenna need not be shared for transmission and reception.

What is claimed is:

1. Linear compensated amplifying equipment comprising:
    a non-linear distortion compensator that determines a non-linear distortion compensation coefficient from a look-up table using instantaneous power of a transmission signal as an address and performs non-linear distortion compensation using a complex product of said determined coefficient and said transmission signal;
    a first quadrature modulator that quadrature-modulates output of said non-linear distortion compensator;

a second quadrature modulator that quadrature-modulates said transmission signal;

a main power amplifier that amplifies output of said first quadrature modulator;

a non-linear distortion extractor that extracts a non-linear distortion signal by controlling a phase and amplitude of one of (a) output of said main power amplifier and (b) output of said second quadrature modulator and by synthesizing said two signals so that said two signals are in opposite phase;

an auxiliary power amplifier that amplifies the extracted non-linear distortion signal; and a modulation signal synthesizer that controls a phase of one of (c) output of said main power amplifier and (d) output of said auxiliary amplifier, and synthesizes said two signals so that said two signals are in opposite phase.

2. The linear compensated amplifying equipment as set forth in claim 1 wherein the control of a phase and amplitude in said non-linear distortion extractor is performed before said main power amplifier.

3. The linear compensated amplifying equipment as set forth in claim 1 wherein the control of a phase in said modulation signal synthesizer is performed before said auxiliary power amplifier.

4. The linear compensated amplifying equipment as set forth in claim 1 wherein the control of a phase and amplitude in said non-linear distortion extractor is performed before said main power amplifier and the control of a phase in said modulation signal synthesizer is performed before said auxiliary power amplifier.

5. Linear compensated amplifying equipment comprising:

a non-linear distortion compensator that computes instantaneous power of a transmission signal, computes a non-linear distortion compensation coefficient using said instantaneous power in accordance with a prepared approximation expression, and performs non-linear distortion compensation using a complex product of said determined coefficient and said transmission signal;

a first quadrature modulator that quadrature-modulates output of said non-linear distortion compensator;

a second quadrature modulator that quadrature-modulates said transmission signal;

a main power amplifier that amplifies output of said first quadrature modulator;

a non-linear distortion extractor that extracts a non-linear distortion signal by controlling a phase and amplitude of one of (a) output of said main power amplifier and (b) output of said second quadrature modulator and by synthesizing said two signals so that said two signals are in opposite phase;

an auxiliary power amplifier that amplifies the extracted non-linear distortion signal; and a modulation signal synthesizer that controls a phase of one of (c) output of said main power amplifier and (d) output of said auxiliary amplifier, and synthesizes said two signals so that said two signals are in opposite phase.

6. The linear compensated amplifying equipment as set forth in claim 5 wherein the control of a phase and amplitude in said non-linear distortion extractor is performed before said main power amplifier.

7. The linear compensated amplifying equipment as set forth in claim 5 wherein the control of a phase in said modulation signal synthesizer is performed before said auxiliary power amplifier.

8. The linear compensated amplifying equipment as set forth in claim 5 wherein the control of a phase and amplitude in said non-linear distortion extractor is performed before said main power amplifier and the control of a phase in said modulation signal synthesizer is performed before said auxiliary power amplifier.

9. Linear compensated amplifying equipment comprising:

a quadrature modulator that quadrature-modulates a transmission signal;

a non-linear distortion compensator that renders characteristics opposite to those of a main power amplifier except for gain to the quadrature-modulated signal;

said main power amplifier that amplifies the modulated signal subjected to non-linear distortion compensation;

a non-linear distortion extractor that controls a phase and amplitude of one of (a) output of said main power amplifier and (b) output of quadrature modulator, and synthesizes said two signals so that said two signals are in opposite phase;

an auxiliary power amplifier that amplifies the extracted non-linear distortion signal; and a modulation signal synthesizer that controls a phase of one of (c) output of said main power amplifier and (d) output of said auxiliary power amplifier, and synthesizes said two signals so that said two signals are in opposite phase.

10. The linear compensated amplifying equipment as set forth in claim 9 wherein the control of a phase and amplitude in said non-linear distortion extractor is performed before said main power amplifier.

11. The linear compensated amplifying equipment as set forth in claim 9 wherein the control of a phase in said modulation signal synthesizer is performed before said auxiliary power amplifier.

12. The linear compensated amplifying equipment as set forth in claim 9 wherein the control of a phase and amplitude in said non-linear distortion extractor is performed before said main power amplifier and the control of a phase in said modulation signal synthesizer is performed before said auxiliary power amplifier.

13. The linear compensated amplifying equipment as set forth in claim 9 wherein said non-linear distortion compensator is made of a non-linear element.

14. Linear compensated amplifying equipment comprising:

a first non-linear distortion compensator that determines a non-linear distortion compensation coefficient from a look-up table using instantaneous power of a transmission signal as an address and performs non-linear distortion compensation using a complex product of said determined coefficient and said transmission signal;

a first quadrature modulator that quadrature-modulates output of said non-linear distortion compensator;

a second quadrature modulator that quadrature-modulates said transmission signal;

a main power amplifier that amplifies output of said first quadrature modulator;

a non-linear distortion extractor that extracts a non-linear distortion signal by controlling a phase and amplitude of one of (a) output of said main power amplifier and (b) output of said second quadrature modulator and by synthesizing said two signals so that said two signals are in opposite phase;

a second non-linear distortion compensator that renders characteristics opposite to those of an auxiliary power amplifier except for gain to the extracted non-linear distortion signal;

said auxiliary amplifier that amplifies output of said second non-linear distortion compensator; and a modulation signal synthesizer that controls a phase of one of (c) output of said main power amplifier and (d) output of said auxiliary power amplifier, and synthesizes said two signals so that said two signals are in opposite phase.

15. The linear compensated amplifying equipment as set forth in claim 14 wherein the control of a phase and amplitude in said non-linear distortion extractor is performed before said main power amplifier.

16. The linear compensated amplifying equipment as set forth in claim 14 wherein the control of a phase in said modulation signal synthesizer is performed before said auxiliary power amplifier.

17. The linear compensated amplifying equipment as set forth in claim 14 wherein the control of a phase and amplitude in said non-linear distortion extractor is performed before said main power amplifier and the control of a phase in said modulation signal synthesizer is performed before said auxiliary power amplifier.

18. The linear compensated amplifying equipment as set forth in claim 14 wherein said second non-linear distortion compensator is made of a non-linear element.

19. Linear compensated amplifying equipment comprising:

a first non-linear distortion compensator that computes instantaneous power of a transmission signal, computes a non-linear distortion compensation coefficient using said instantaneous power in accordance with a prepared approximation expression, and performs non-linear distortion compensation using a complex product of said determined coefficient and said transmission signal;

a first quadrature modulator that quadrature-modulates output of said non-linear distortion compensator;

a second quadrature modulator that quadrature-modulates said transmission signal;

a main power amplifier that amplifies output of said first quadrature modulator;

a non-linear distortion extractor that extracts a non-linear distortion signal by controlling a phase and amplitude of one of (a) output of said main power amplifier and (b) output of said second quadrature modulator and by synthesizing said two signals so that said two signals are in opposite phase;

a second non-linear distortion compensator that renders characteristics opposite to those of an auxiliary power amplifier except for gain to the extracted non-linear distortion signal;

said auxiliary power amplifier that amplifies output of said second non-linear distortion compensator; and a modulation signal synthesizer that controls a phase of one of (c) output of said main power amplifier and (d) output of said auxiliary power amplifier, and synthesizes said two signals so that said two signals are in opposite phase.

20. The linear compensated amplifying equipment as set forth in claim 19 wherein the control of a phase and amplitude in said non-linear distortion extractor is performed before said main power amplifier.

21. The linear compensated amplifying equipment as set forth in claim 19 wherein the control of a phase in said modulation signal synthesizer is performed before said auxiliary power amplifier.

22. The linear compensated amplifying equipment as set forth in claim 19 wherein the control of a phase and amplitude in said non-linear distortion extractor is performed before said main power amplifier and the control of a phase in said modulation signal synthesizer is performed before said auxiliary power amplifier.

23. The linear compensated amplifying equipment as set forth in claim 19 wherein said second non-linear distortion compensator is made of a non-linear element.

24. Linear compensated amplifying equipment comprising:

a quadrature modulator that quadrature-modulates a transmission signal;

a non-linear distortion compensator that renders characteristics opposite to those of a main power amplifier except for gain to the quadrature-modulated signal;

said main power amplifier that amplifies the modulated signal subjected to non-linear distortion compensation;

a non-linear distortion extractor that controls a phase and amplitude of one of (a) output of said main power amplifier and (b) output of said quadrature modulator, and synthesizes said two signals so that said two signals are in opposite phase;

a second non-linear distortion compensator that renders characteristics opposite to those of an auxiliary power amplifier except for gain to the extracted non-linear distortion signal;

said auxiliary power amplifier that amplifies output of said second non-linear distortion compensator; and a modulation signal synthesizer that controls a phase of one of (c) output of said main power amplifier and (d) output of said auxiliary power amplifier, and synthesizes said two signals so that said two signals are in opposite phase.

25. The linear compensated amplifying equipment as set forth in claim 24 wherein the control of a phase and amplitude in said non-linear distortion extractor is performed before said main power amplifier.

26. The linear compensated amplifying equipment as set forth in claim 24 wherein the control of a phase in said modulation signal synthesizer is performed before said auxiliary power amplifier.

27. The linear compensated amplifying equipment as set forth in claim 24 wherein the control of a phase and amplitude in said non-linear distortion extractor is performed before said main power amplifier and the control of a phase in said modulation signal synthesizer is performed before said auxiliary power amplifier.

28. The linear compensated amplifying equipment as set forth in claim 24 wherein said second non-linear distortion compensator is made of a non-linear element.

* * * * *